United States Patent
Omandam et al.

(10) Patent No.: US 7,829,384 B2
(45) Date of Patent: Nov. 9, 2010

(54) SEMICONDUCTOR DEVICE AND METHOD OF LASER-MARKING WAFERS WITH TAPE APPLIED TO ITS ACTIVE SURFACE

(75) Inventors: Glenn Omandam, Singapore (SG); Sheila M. Alvarez, Singapore (SG); Ma. Shirley Asoy, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 103 days.

(21) Appl. No.: 12/205,695

(22) Filed: Sep. 5, 2008

(65) Prior Publication Data

US 2009/0081830 A1 Mar. 26, 2009

Related U.S. Application Data

(60) Provisional application No. 60/975,122, filed on Sep. 25, 2007.

(51) Int. Cl.
*H01L 21/00* (2006.01)
(52) U.S. Cl. ............... 438/118; 438/106; 257/E23.001; 257/E23.179
(58) Field of Classification Search ................. 438/106, 438/118, 490–692, 942; 257/E23.001, E23.179
See application file for complete search history.

(56) References Cited

U.S. PATENT DOCUMENTS

| | | | |
|---|---|---|---|
| 6,465,330 B1 * | 10/2002 | Takahashi et al. ........... 438/464 |
| 6,949,158 B2 * | 9/2005 | Ball et al. .................... 156/154 |
| 7,235,426 B2 | 6/2007 | Tsai | |
| 7,700,458 B2 * | 4/2010 | Do et al. ...................... 438/464 |
| 2003/0192866 A1 * | 10/2003 | Han ....................... 219/121.69 |
| 2007/0111346 A1 * | 5/2007 | Tsai ............................. 438/22 |

* cited by examiner

*Primary Examiner*—Michael S. Lebentritt
*Assistant Examiner*—Daniel Whalen
(74) *Attorney, Agent, or Firm*—Robert D. Atkins

(57) ABSTRACT

A method of laser-marking a semiconductor device involves providing a semiconductor wafer having a plurality of solder bumps formed on contact pads disposed on its active surface. The solder bumps have a diameter of about 250-280 μm. A backgrinding tape is applied over the solder bumps. The tape is translucent to optical images. A backside of the semiconductor wafer, opposite the active surface, undergoes grinding to reduce wafer thickness. The backside of the semiconductor wafer is laser-marked while the tape remains applied to the solder bumps. The laser-marking system including an optical recognition device, control system, and laser. The optical recognition device reads patterns on the active surface through the tape to control the laser. The tape reduces wafer warpage during laser-marking to about 0.3-0.5 mm. The tape is removed after laser-marking the backside of the semiconductor wafer.

19 Claims, 7 Drawing Sheets

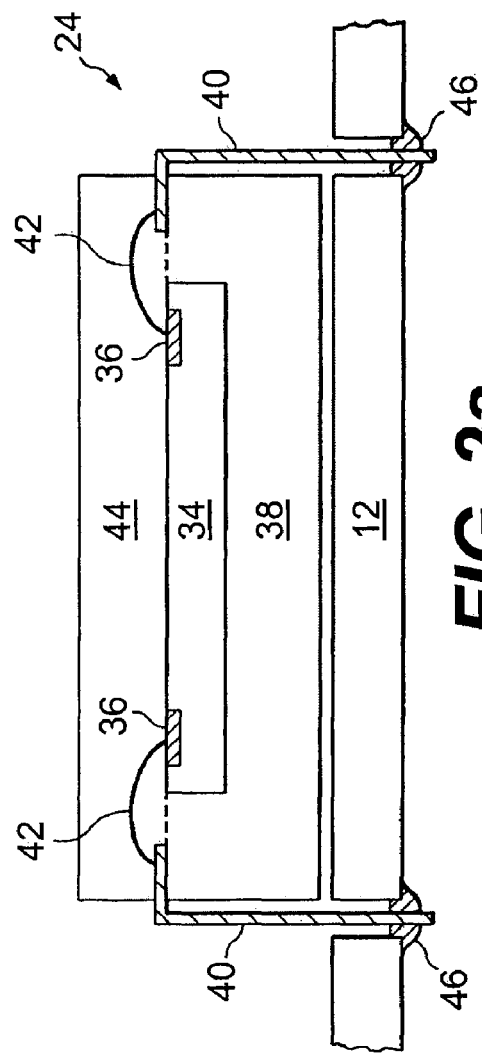
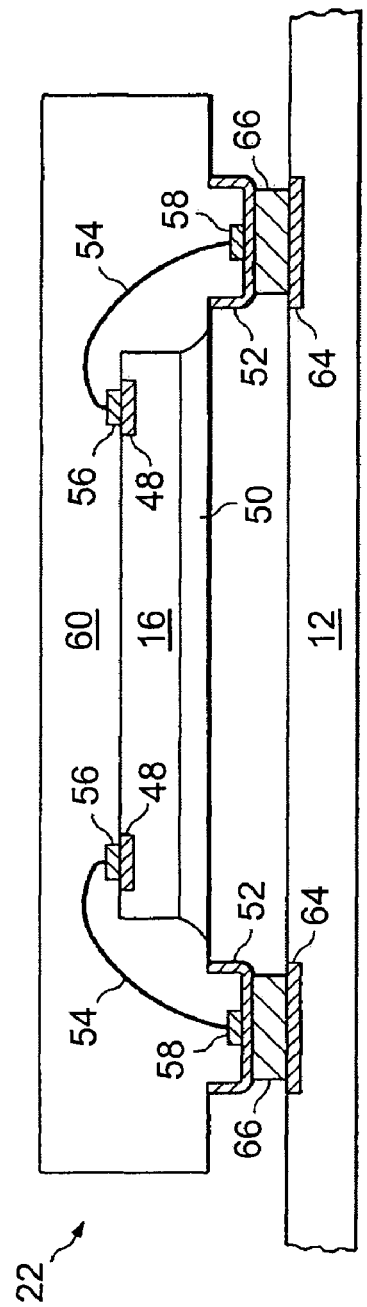

SEMICONDUCTOR DEVICE AND METHOD OF LASER-MARKING WAFERS WITH TAPE APPLIED TO ITS ACTIVE SURFACE

CLAIM TO DOMESTIC PRIORITY

The present nonprovisional application claims the benefit of priority of U.S. Provisional Application Ser. No. 60/975,122, filed Sep. 25, 2008, entitled "Optional Method of Processing Bumped Wafers" by Glenn Omandam et al.

FIELD OF THE INVENTION

The present invention relates in general to semiconductor devices and, more particularly, to a method of laser-marking wafers with tape applied to its active surface.

BACKGROUND OF THE INVENTION

Semiconductor devices are ubiquitous in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is identical and contains circuits formed by electrically connecting active and passive components. Back-end manufacturing involves singulating individual die from the finished wafer and packaging the die to provide structural support and environmental isolation.

In the back-end manufacturing process, the wafers are commonly marked with a laser. The laser-marking may occur on the backside of the wafer to avoid damaging the active surface. The laser-marking can denote company logos and trademarks, identification of known good units, pin orientation, manufacturing history, lot number, time/date traceability, and component identification. For example, the marking can be used to facilitate traceability of the manufacturing process for fault analysis of semiconductor devices. The marking must be machine-readable, miniaturized and have no negative influence on the further manufacturing steps and still permit clear identification at the end of the process chain. The laser-marking can be numbers, letters, bar codes, dot matrix codes, and other identifying patterns and symbols.

In applications requiring both large solder bumps and thin wafers, wafer warpage or breakage is a recurring manufacturing issue in view of the bump height variation and stress of reflowing the large solder bumps on the thin wafer. The warped semiconductor wafers may have 0.8-1.0 millimeter (mm) variation across the surface.

Many laser-marking systems have difficulty processing wafers with a high degree of warping. When the wafer warpage reaches the range of 0.8-1.0 millimeter or above, the laser-marking machine encounters a vacuum error as it cannot make a seal on the warped surface to pick up the wafer. In addition, the laser resolution degrades over the uneven warped surface. The laser-marking error interrupts the process flow, reduces yield, and increase manufacturing costs.

SUMMARY OF THE INVENTION

A need exists to laser-mark wafers which are susceptible to a high degree of warpage. Accordingly, in one embodiment, the present invention is a method of laser-marking a semiconductor device comprising the steps of providing a semiconductor wafer having a plurality of solder bumps formed on contact pads disposed on its active surface, applying tape over the solder bumps, grinding a backside of the semiconductor wafer, opposite the active surface, to reduce wafer thickness, laser-marking the backside of the semiconductor wafer while the tape remains applied to the solder bumps, and removing the tape after laser-marking the backside of the semiconductor wafer.

In another embodiment, the present invention is a method of making a semiconductor device comprising the steps of providing a semiconductor wafer having a plurality solder bumps formed on its active surface, applying tape over the solder bumps, grinding a backside of the semiconductor wafer, opposite the active surface, to reduce wafer thickness, laser-marking the backside of the semiconductor wafer while the tape remains applied to the solder bumps, and removing the tape after laser-marking the backside of the semiconductor wafer.

In another embodiment, the present invention is a method of making a semiconductor device comprising the steps of providing a semiconductor wafer, applying tape over an active surface of the semiconductor wafer, laser-marking a backside of the semiconductor wafer, opposite the active surface, while the tape remains applied to the active surface, and removing the tape after laser-marking the backside of the semiconductor wafer.

BRIEF DESCRIPTION OF THE DRAWINGS

FIGS. 2a-2c illustrate further detail of the representative semiconductor packages mounted to the PCB;

DETAILED DESCRIPTION OF THE DRAWINGS

Figure 1:
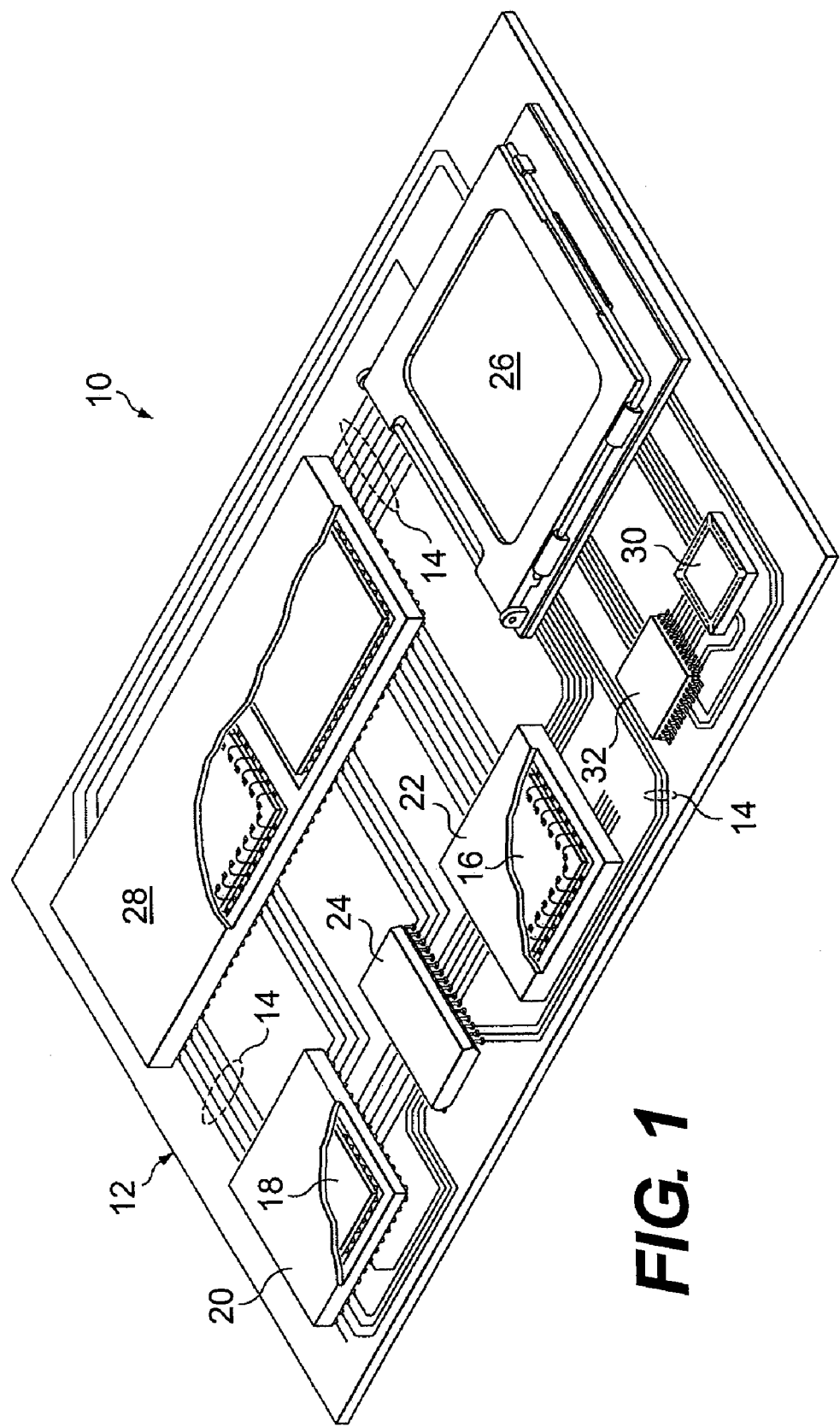
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, thin film deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by thin film deposition. The type of material being deposited determines the thin film deposition technique. The thin film deposition techniques include chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Some types of materials are patterned without being etched; instead patterns are formed by directly depositing the material into the areas or voids formed by a previous deposition/etch process using techniques such as electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical remove any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. In some cases, the wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically attached directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as plastic or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Mold compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
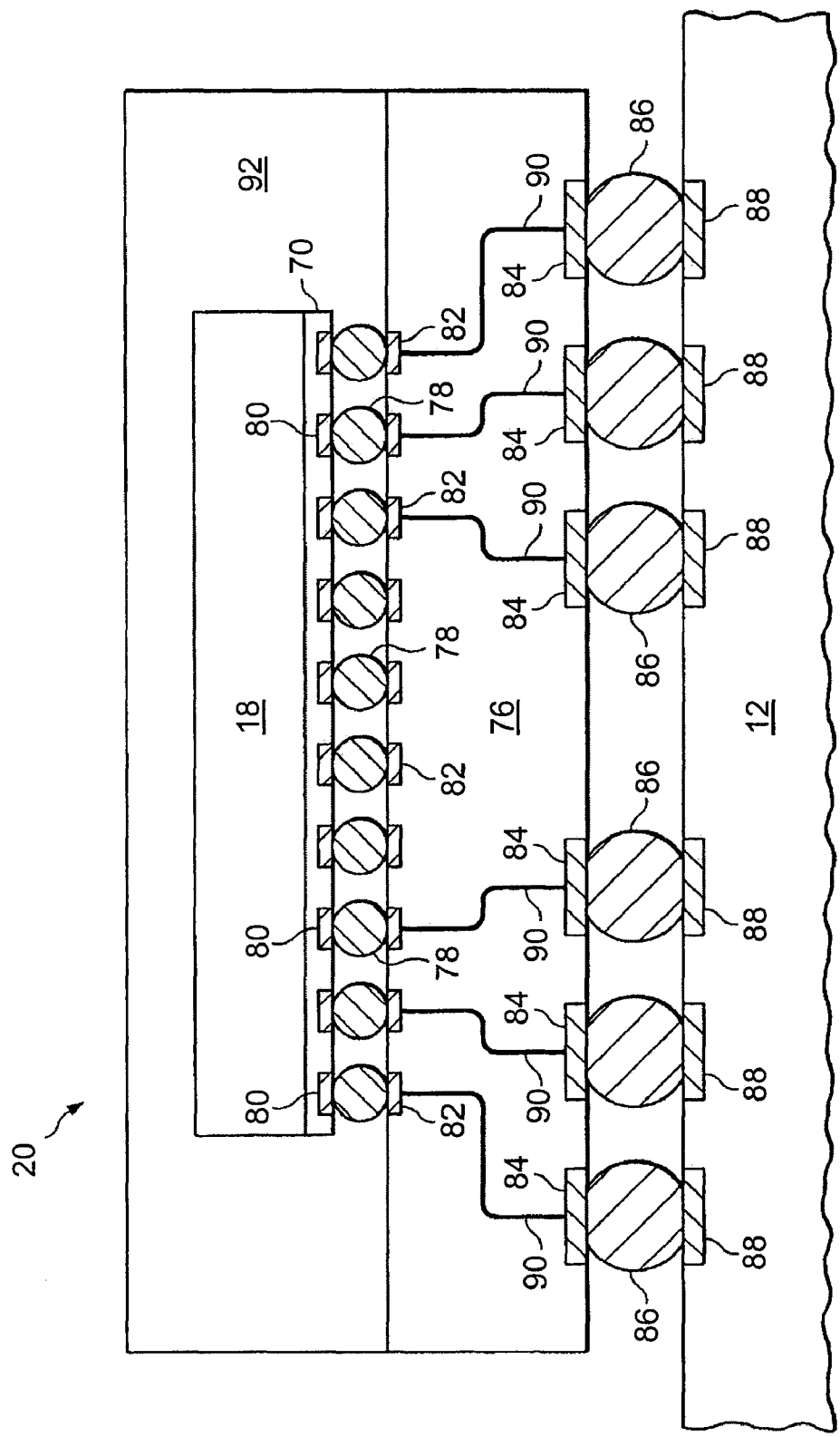

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to the carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Mold compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
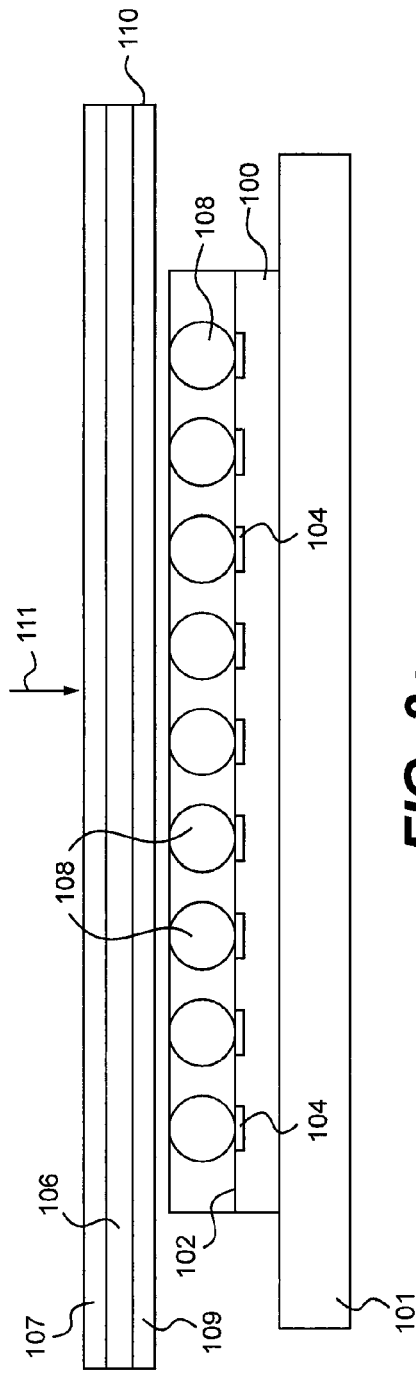
FIGS. 3a-3b illustrate application of backgrinding tape to solder bumps formed on an active surface of a semiconductor wafer.

FIG. 3a illustrates a semiconductor wafer 100 made with silicon, germanium, gallium arsenide, indium phosphide, or other bulk semiconductor material. Wafer 100 is mounted to carrier 101 with an adhesive. Semiconductor wafer 100 may have an original thickness in the range of 700-800 micrometers (μm). In some cases as discussed below, the wafer thickness is reduced for smaller packaging. Wafer 100 includes a plurality of semiconductor die each having active and passive devices, integrated passive devices (IPD), conductive layers, and dielectric layers formed on active surface 102 according to the electrical design of the die.

In particular, a metal layer is deposited over wafer 100 using an evaporation, electrolytic plating, electroless plating, or screen printing process to form contact pads 104. Contact pads 104 can be titanium (Ti), Ni, nickel vanadium (NiV), Cu, or Cu alloy. Contact pads 104 connect to conductive layers in active surface 102 to provide the electrical interconnect for each semiconductor die. An electrically conductive solder material is deposited over contact pads 104 using an evaporation, electrolytic plating, electroless plating, ball drop, or screen printing process. The solder material can be metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 108. The solder bump structure is relatively large, on the order of 250-280 μm and more. In some applications, solder bumps 108 are reflowed a second time to improve electrical contact to contact pads 104.

Figure 3B:
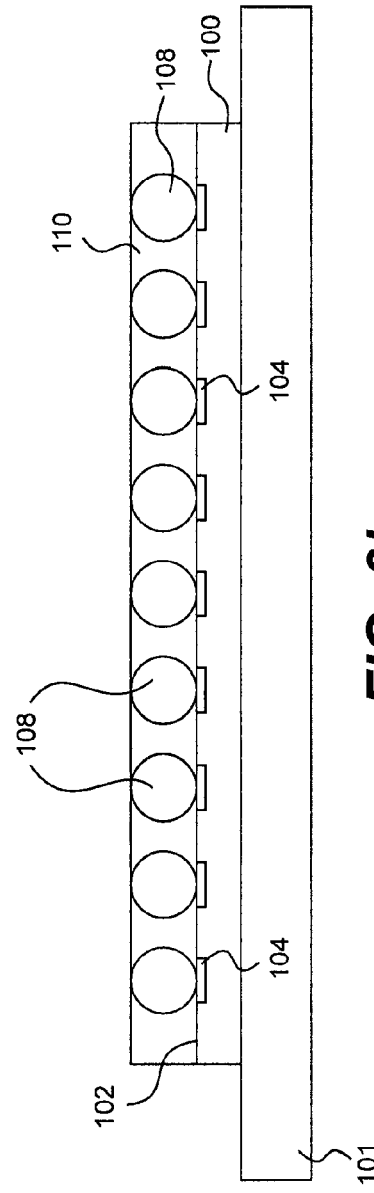

An ultraviolet (UV) backgrinding tape 110 is applied over solder bump structure 108. In one embodiment, UV backgrinding tape 110 includes layers of backing film 107, adhesive layer 106, and protective film 109. The backing film 107 can be polyolefin; the adhesive layer 106 can be acrylic; and the protective film 109 can be polyethylene terephthalate (PET). UV tape 110 is typically colorless or blue with optically translucent properties. The backgrinding tape 110 is pressed onto solder bump structure 108, as shown by arrow 111. FIG. 3b shows backgrinding tape 110 surrounding solder bumps 108 and contacting active surface 102 and contact pads 104. In general, UV tape 110 is characterized by a strong adhesive strength upon application. The tape is easily peeled away after exposure to UV radiation.

Figure 4:
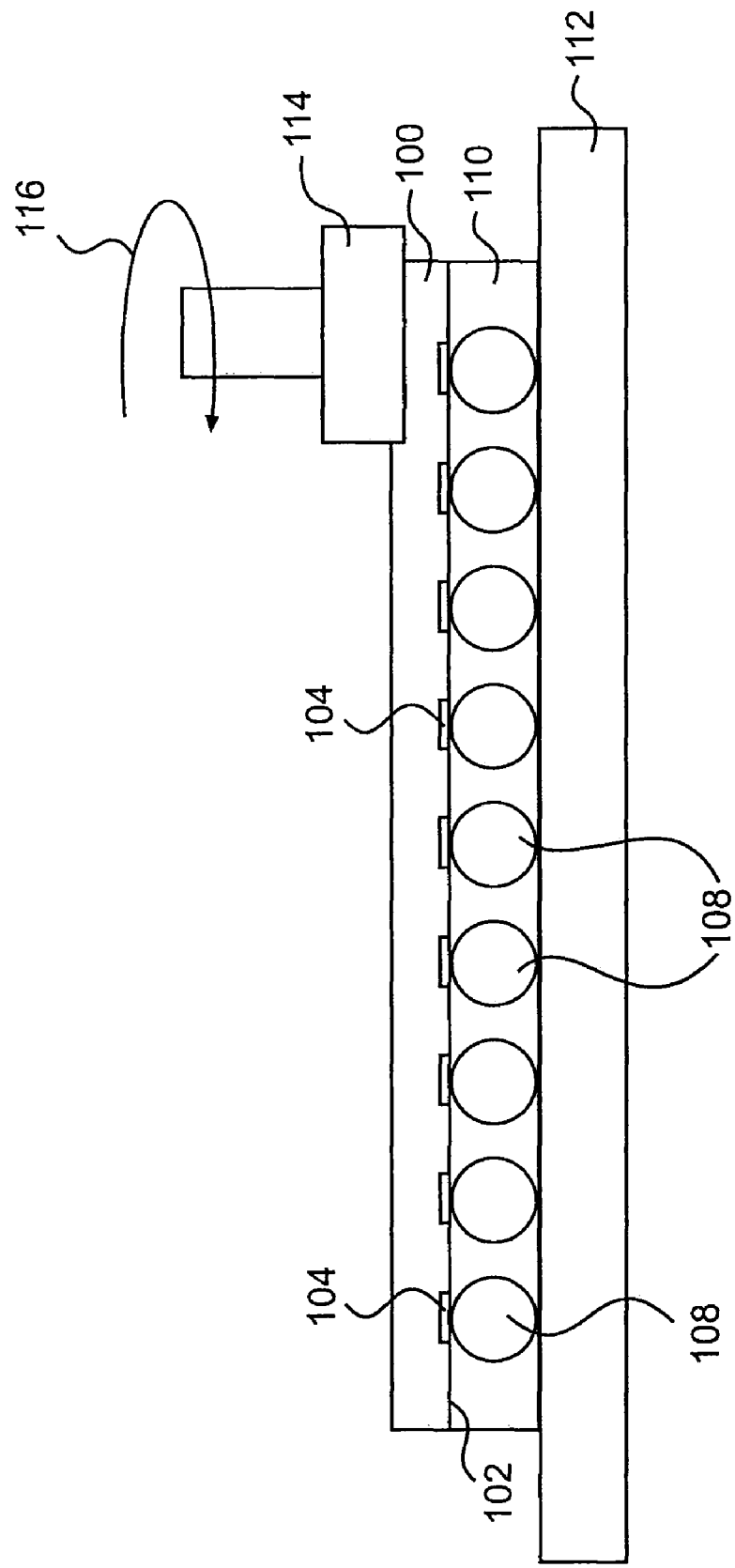
FIG. 4 illustrates backgrinding the wafer to reduce thickness.

In many cases, it is desired to make semiconductor wafer 100 thinner. Accordingly, in FIG. 4, semiconductor wafer 100 is inverted and attached to carrier 112, leading with backgrinding tape 110. Carrier 101 is then removed. A backside of semiconductor wafer 100, opposite active surface 102, undergoes coarse backgrinding using a mechanical grinder 114 rotating in the direction of arrow 116. An additional wet etching step can be used for a finer removal of the bulk wafer material. Alternatively, plasma etching and/or a chemical-mechanical planarization (CMP) process can be used to remove a portion of the backside of wafer 100. The backgrinding process reduces the thickness of semiconductor wafer 100 by about 300-350 μm.

Semiconductor wafers, as well as individual die, are commonly marked with a laser. The laser-marking may occur on the backside of the wafer to avoid damaging the active surface. The laser-marking can denote company logos and trademarks, identification of known good units, pin orientation, manufacturing history, lot number, time/date traceability, and component identification. For example, the marking can be used to facilitate traceability of the manufacturing process for fault analysis of semiconductor devices. The marking must be machine-readable, miniaturized and have no negative influence on the further manufacturing steps and still permit clear identification at the end of the process chain. The laser-marking can be numbers, letters, bar codes, dot matrix codes, and other identifying patterns and symbols.

Figure 5:
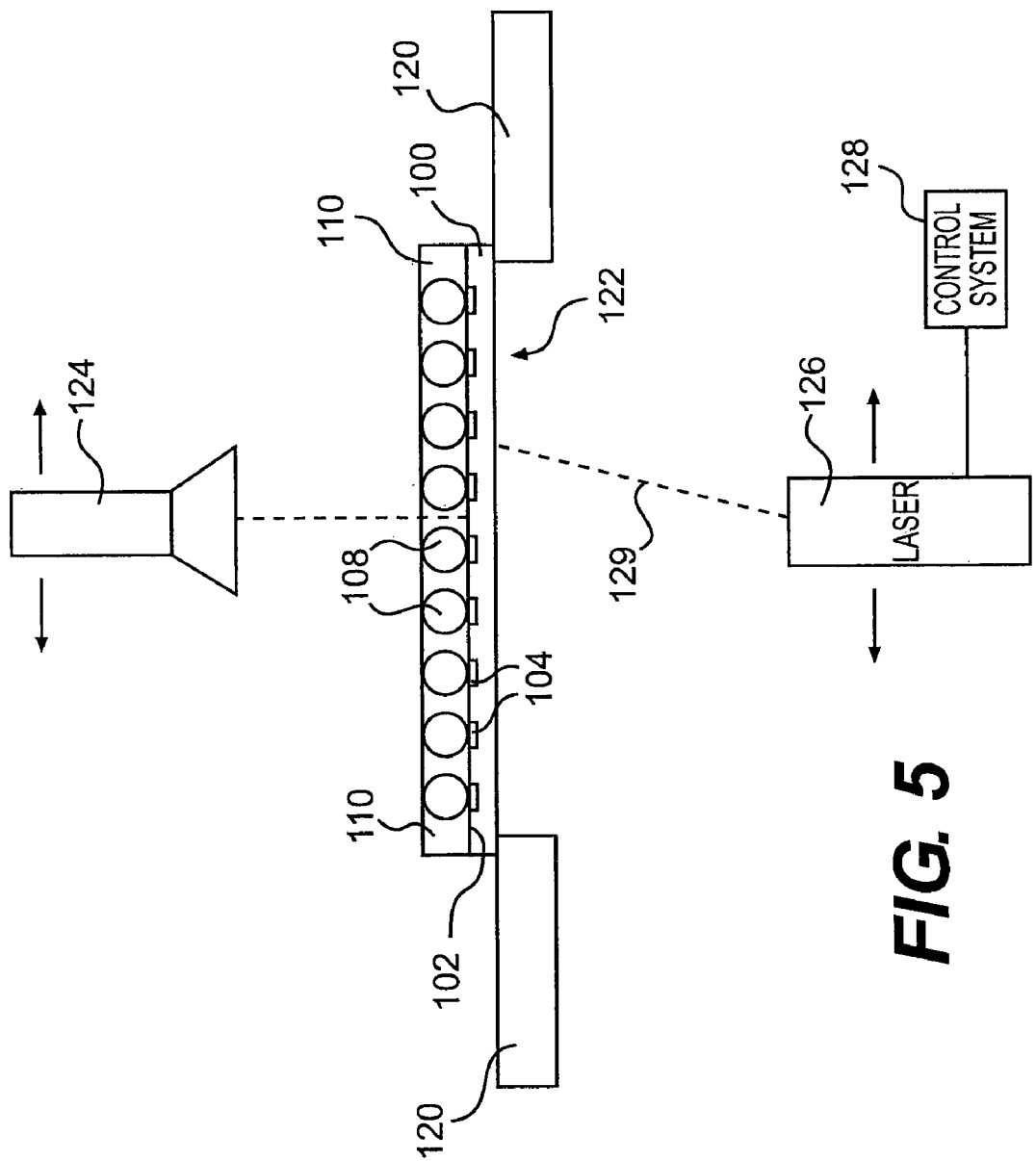
FIG. 5 illustrates a laser-marking system imaging surface patterns through the translucent tape in order to laser-mark the semiconductor wafer.

To perform laser-marking, semiconductor wafer 100 is mounted to laser-marking table 120 with its backside facing down, as shown in FIG. 5. The thin wafer 100 shown in FIG. 5 has already gone through the backgrinding process to reduce wafer thickness, as described in FIG. 4. Table 120 includes an opening 122 for the laser beam to radiate the backside of the wafer. Optical recognition device 124, e.g., camera or active imaging, reads patterns on active surface 102 and controls laser 126 accordingly. For example, optical recognition device 124 identifies demarcation lines between semiconductor die or other reference points on wafer 100. Optical recognition device 124 also determines distances between reference points on wafer 100.

Laser 126 is controlled by a vector marking program executing through a microcontroller, memory, and electronic interface in control system 128. The vector marking program in control system 128 controls the direction, intensity, speed of movement, and spread of laser beam 129 aimed at the wafer. Either optical recognition device 124 and laser 126 move with respect to a fixed table 120, or table 120 moves with respect to a fixed optical recognition device 124 and laser 126. Laser beam 129 marks the backside surface of wafer 100 to imprint the laser-marking patterns and symbols. Laser 126 moves according to an x-y defined vector and is switched on and off along the vector to make precise and clean marks. Laser 126 may be carbon dioxide ($CO_2$), Q-switch, neodymium-doped yttrium aluminium garnet (Nd:YAG), excimer, or second harmonic generation (SHG) laser.

In applications requiring both large solder bumps and thin wafers, wafer warpage or breakage is a recurring manufacturing issue in view of the bump height variation and stress of reflowing the large solder bumps on the thin wafer. The backgrinding tape 110 on wafer 100 reduces the warpage to about 0.3-0.5 mm. Thus, by leaving backgrinding tape 110 on semiconductor wafer 100 during laser-marking, wafers that would otherwise exhibit significant warpage, i.e., without tape, can be processed through the laser-marking system. The translucent properties of backgrinding tape 110 allows optical recognition device 124 to read through the tape to recognize patterns on active surface 102. Thus, even with backgrinding tape 110 in place, optical recognition device 124 is able image patterns on active surface 102 and control laser 126 to accurately mark the backside of wafer 100, as well as the individual die on the wafer.

Figure 6:
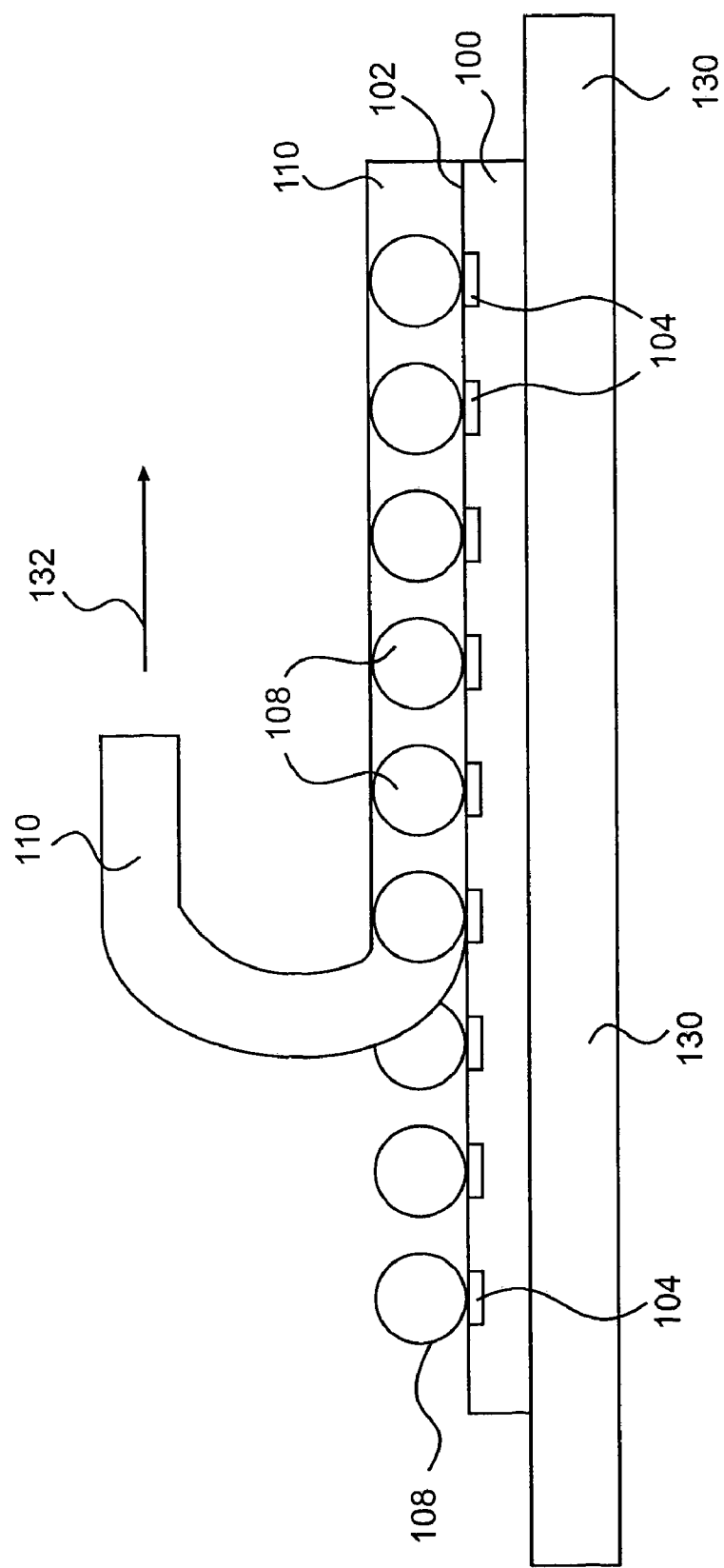
FIG. 6 illustrates removal of the backgrinding tape after laser-marking.

In FIG. 6, semiconductor wafer 100 is placed on carrier 130 after the laser-marking process. Backgrinding tape 110 is then removed.

In summary, by leaving the backgrinding tape on the wafer while laser-marking, wafers which are susceptible to high warpage can be processed through the laser-marking system. The backgrinding tape 110 reduces the amount of flex exhibited in wafer 100 to a level that can be handled by the laser-marking system. With less flex in wafer 100, i.e., flatter profile, the laser-marking system is able to hold vacuum while moving the wafer. In addition, the flatter surface increases resolution of the laser-mark. Since the backgrinding tape 110 is providing a useful function during laser-marking, i.e., reducing wafer warpage, the tape is removed only after laser-marking is complete.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of laser-marking a semiconductor device, comprising:
    providing a first carrier;
    providing a semiconductor wafer having a plurality of bumps formed on contact pads disposed on an active surface of the semiconductor wafer, the bumps having a height of 250-280 micrometers;
    mounting a back surface of the semiconductor wafer, opposite the active surface, to the first carrier for structural support;
    applying a tape over the bumps of the semiconductor wafer, the tape having optically translucent properties and a thickness substantially equal to the height of the bumps;
    providing a second carrier;
    leading with the tape, mounting the semiconductor wafer to the second carrier for structural support;
    removing the first carrier;
    removing a portion of the backside of the semiconductor wafer while mounted to the second carrier to reduce wafer thickness by backgrinding using a mechanical grinder followed by wet etching;
    removing the second carrier after reducing the wafer thickness;
    laser-marking the backside of the semiconductor wafer while the tape remains applied to the bumps, wherein the tape reduces wafer warpage during laser-marking to about 0.3-0.5 millimeters; and
    removing the tape from the bumps after laser-marking the backside of the semiconductor wafer.

2. The method of claim 1, wherein the tape is made with layers of polyolefin, acrylic, and polyethylene terephthalate.

3. The method of claim 1, wherein the tape contacts the active surface of the semiconductor wafer.

4. The method of claim 1, further including providing a laser-marking system including an optical recognition device, control system, and laser, the optical recognition device reading patterns on the active surface through the tape to control the laser.

5. A method of making a semiconductor device, comprising:
    providing a first carrier;
    providing a semiconductor wafer having a plurality of bumps formed on an active surface of the semiconductor wafer;
    mounting a back surface of the semiconductor wafer, opposite the active surface, to the first carrier for structural support;
    applying an optically translucent tape over the bumps of the semiconductor wafer, the optically translucent tape having a thickness substantially equal to a height of the bumps;
    providing a second carrier;
    mounting the optically translucent tape and semiconductor wafer to the second carrier for structural support;
    removing the first carrier;
    removing a portion of the backside of the semiconductor wafer while mounted to the second carrier to reduce wafer thickness;
    removing the second carrier after reducing the wafer thickness;
    laser-marking the backside of the semiconductor wafer while the optically translucent tape remains applied to the bumps, wherein the optically translucent tape reduces wafer warpage during laser-marking to about 0.3-0.5 millimeters; and
    removing the optically translucent tape after laser-marking the backside of the semiconductor wafer.

6. The method of claim 5, wherein the optically translucent tape is made with layers of polyolefin, acrylic, and polyethylene terephthalate.

7. The method of claim 5, wherein the optically translucent tape contacts the active surface of the semiconductor wafer.

8. The method of claim 5, further including providing a laser-marking system including an optical recognition device, control system, and laser, the optical recognition device reading patterns on the active surface through the optically translucent tape to control the laser.

9. The method of claim 5, wherein the height of the bumps is about 250-280 micrometers.

10. A method of making a semiconductor device, comprising:
    providing a semiconductor wafer having a plurality of bumps formed on a first surface of the semiconductor wafer;
    applying an optically translucent tape over the bumps of the semiconductor wafer, the optically translucent tape having a thickness substantially equal to a height of the bumps;
    providing a carrier;
    leading with the optically translucent tape, mounting the semiconductor wafer to the carrier for structural support;
    removing a portion of a second surface of the semiconductor wafer, opposite the first surface, while mounted to the carrier to reduce wafer thickness;
    removing the carrier after reducing the wafer thickness;
    laser-marking the second surface of the semiconductor wafer while the optically translucent tape remains applied to the first surface, wherein the optically translucent tape reduces wafer warpage during laser-marking to about 0.3-0.5 millimeters; and
    removing the optically translucent tape after laser-marking the second surface of the semiconductor wafer.

11. The method of claim 10, further including forming the plurality of bumps on contact pads disposed on the active surface of the semiconductor wafer.

12. The method of claim 10, wherein the optically translucent tape is made with layers of polyolefin, acrylic, and polyethylene terephthalate.

13. The method of claim 10, further including providing a laser-marking system including an optical recognition device, control system, and laser, the optical recognition device reading patterns on the first surface through the optically translucent tape to control the laser.

14. The method of claim 10, wherein the height of the bumps is about 250-280 micrometers.

15. A method of making a semiconductor device, comprising:
    providing a semiconductor wafer having a plurality of bumps formed on a first surface of the semiconductor wafer;
    applying an optically translucent tape over the bumps of the semiconductor wafer, the optically translucent tape having a thickness substantially equal to a height of the bumps;
    providing a first carrier;

leading with the optically translucent tape, mounting the semiconductor wafer to the first carrier for structural support;

removing a portion of a second surface of the semiconductor wafer, opposite the first surface, while mounted to the first carrier to reduce wafer thickness;

removing the first carrier after reducing the wafer thickness;

laser-marking the backside of the semiconductor wafer while the optically translucent tape remains applied to the bumps, wherein the optically translucent tape reduces wafer warpage during laser-marking to about 0.3-0.5 millimeters; and removing the optically translucent tape from the bumps after laser-marking the backside of the semiconductor wafer.

16. The method of claim 15, wherein the optically translucent tape includes layers of polyolefin, acrylic, and polyethylene terephthalate.

17. The method of claim 15, further including providing a laser-marking system including an optical recognition device, control system, and laser, the optical recognition device reading patterns on the first surface through the optically translucent tape to control the laser.

18. The method of claim 15, wherein the height of the bumps is about 250-280 micrometers.

19. The method of claim 15, further including:

providing a second carrier;

mounting the second surface of the semiconductor wafer to the first carrier for structural support prior to applying the optically translucent tape over the bumps of the semiconductor wafer; and removing the second carrier after mounting the optically translucent tape and semiconductor wafer to the first carrier.

* * * * *